United States Patent
Wang et al.

[11] Patent Number: 6,132,222
[45] Date of Patent: Oct. 17, 2000

[54] BGA SOCKET TERMINAL

[75] Inventors: Jwo-Min Wang, Shin-Dian; Shih-Wei Hsiao, Tu-Chen; Ming-Lun Szu, Taipei, all of Taiwan

[73] Assignee: Hon Hai Precision Ind. Co., Ltd., Taipei Hsien, Taiwan

[21] Appl. No.: 09/306,515

[22] Filed: May 6, 1999

[30]  Foreign Application Priority Data

Dec. 28, 1998 [TW] Taiwan ................................. 87221631

[51] Int. Cl.⁷ .................................................... H01R 1/00
[52] U.S. Cl. ................................................. 439/70; 439/83
[58] Field of Search ............................... 439/70, 83, 525, 439/874, 876

[56]  References Cited

U.S. PATENT DOCUMENTS

| | | | |
|---|---|---|---|
| 4,341,433 | 7/1982 | Cherian et al. ......................... | 439/525 |
| 4,637,670 | 1/1987 | Collar et al. ............................... | 439/70 |
| 4,775,333 | 10/1988 | Grider et al. .............................. | 439/83 |
| 5,201,663 | 4/1993 | Kikuchi et al. ........................... | 439/83 |
| 5,746,608 | 5/1998 | Taylor ....................................... | 439/70 |

*Primary Examiner*—T. C. Patel
*Attorney, Agent, or Firm*—Wei Te Chung

[57]  ABSTRACT

A socket for providing electrical connection between an IC and a mother board comprises an insulative housing defining a number of terminal passageways and a number of terminals received in the passageways. Each terminal includes a contact portion, a securing portion, an adjustment portion and a soldering portion. The contact portion is adapted to engage a pin of the IC. The securing portion is interferentially fit in the passageway for retaining the terminal therein. The feature of the invention lies in the resilient adjustment portion which can be easily and resiliently deformed.

10 Claims, 8 Drawing Sheets

BGA SOCKET TERMINAL

BACKGROUND OF THE INVENTION

The present invention generally relates to a socket for connecting an IC (Integrated Circuit) to a printed circuit board (PCB), and particularly to a socket including terminals each having a resilient adjustment mechanism which allows the socket to be displaced relative to the PCB due to different coefficients of thermal expansion (CTE) between a housing of the socket and the PCB, without a disconnection between the terminals and the PCB.

Terminals of conventional sockets are mounted to a mother board using Through Hole Technology. Such a method need to form through holes in the mother board thereby hindering an efficient layout of components on the mother board. The related prior art is disclosed in U.S. Pat. Nos. 5,562,474 and 5,730,606.

Newly developed sockets, such as the socket 7 shown in FIG. 8, are mounted to a mother board 8 using Surface Mounting Technology. The socket 7 includes an insulative housing 70 defining a plurality of terminal passageways 73 and a plurality of terminals 74 received in the passageways 73. Each terminal 74 has a curved contact portion 71 and a soldering portion 72 perpendicularly extending from a lower end thereof. The contact portion 71 is adapted to engage a pin 81 of an IC 82. The soldering portion 72 projects out of the passageway 73 for being soldered to an electrical pad 80 on a mother board 8 as follows. A solder ball 9 is attached to the soldering portion 72 of the terminal 74 and then positioned on the pad 80 on the mother board 8. After being processed by an infrared soldering procedure, the solder ball 9 becomes molten and bonds the soldering portion 72 of the terminal 74 and the pad 80 on the mother board 8 together.

It is readily apparent that such a method can promote an efficient use of space on the mother board 8. However, the housing 70 is usually made from a material with a different CTE (Coefficient of Thermal Expansion) than the mother board 8. Thus, the relative position of the housing 70 and the mother board 8 is likely to change significantly during the soldering process, which adversely affects the quality of the solder engagement between the soldering portion 72 of the terminal 74 and the pad 80 of the mother board 8.

A common way to solve the problem of different CETs is to manufacture the housing and the mother board from material having the same CTE. However, such a solution is not workable since the material forming the mother board is expensive thereby increasing the cost of the socket.

SUMMARY OF THE INVENTION

Accordingly, a purpose of the present invention is to provide a socket with terminals, each terminal having a resilient adjustment mechanism which allows the socket to be conveniently soldered to a mother board using Surface Mounting Technology.

To fulfill the above-mentioned purpose, a socket for providing electrical connection between an IC and a mother board comprises an insulative housing defining a plurality of terminal passageways and a plurality of terminals received in the passageways. Each terminal includes a contact portion, a securing portion, an adjustment portion and a soldering portion. The contact portion is adapted to engage a pin of the IC. The securing portion is interferentially fit in the passageway for retaining the terminal therein. The feature of the invention lies in the resilient adjustment portion which can be easily and resiliently deformed. The adjustment portion may have a structure that is gracile or twisted. Alternatively, the adjustment portion may have a toroidal structure. Each passageway of the housing defines a wide section for allowing the adjustment portion of the terminal to move therein. Thus, the adjustment portion of the terminal eliminates the adverse affects due to the relative movement between the mother board and the housing during soldering.

DETAILED DESCRIPTION OF THE PREFERRED EMBODIMENT

Figure 1:
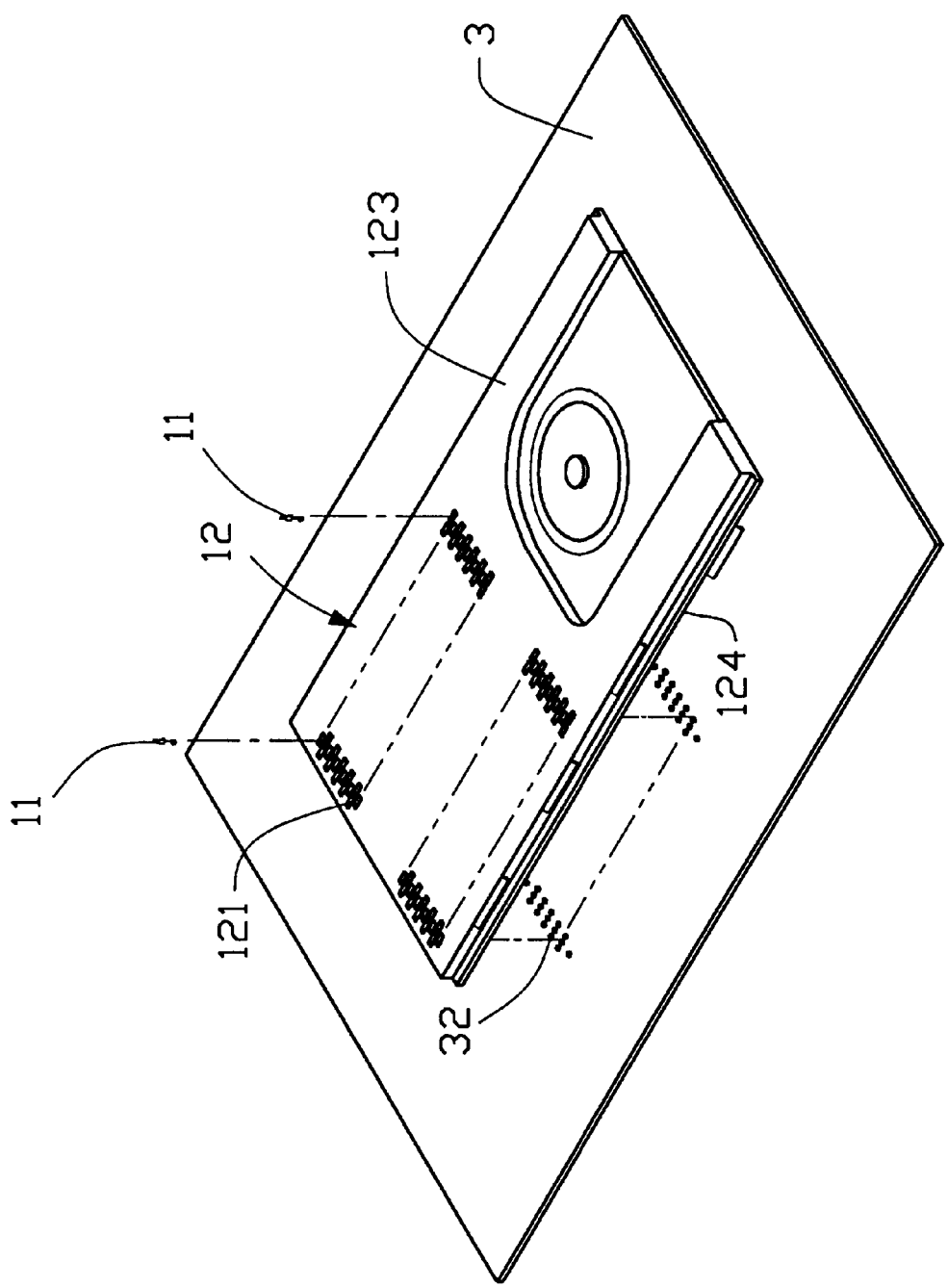
FIG. 1 is a perspective view of a socket in accordance with the present invention and a mother board.

Referring to FIG. 1, a socket comprises a planar insulative housing 12 defining a plurality of terminal passageways 121 and a plurality of terminals 11 received in the passageways 121. The passageways 121 are defined through the housing 12 between a top surface 123 and a bottom surface 124 and are disposed in rows for receiving the corresponding terminals 11 therein.

Figure 2:
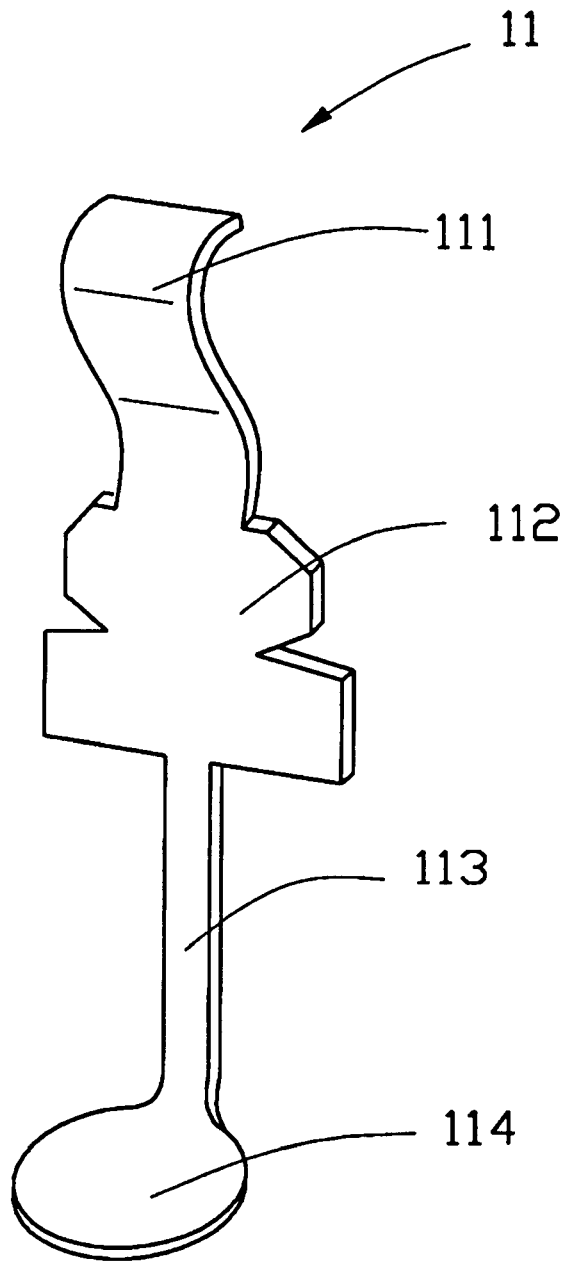
FIG. 2 is a perspective view of a terminal of a first embodiment used in the socket of the present invention.
Figure 3:
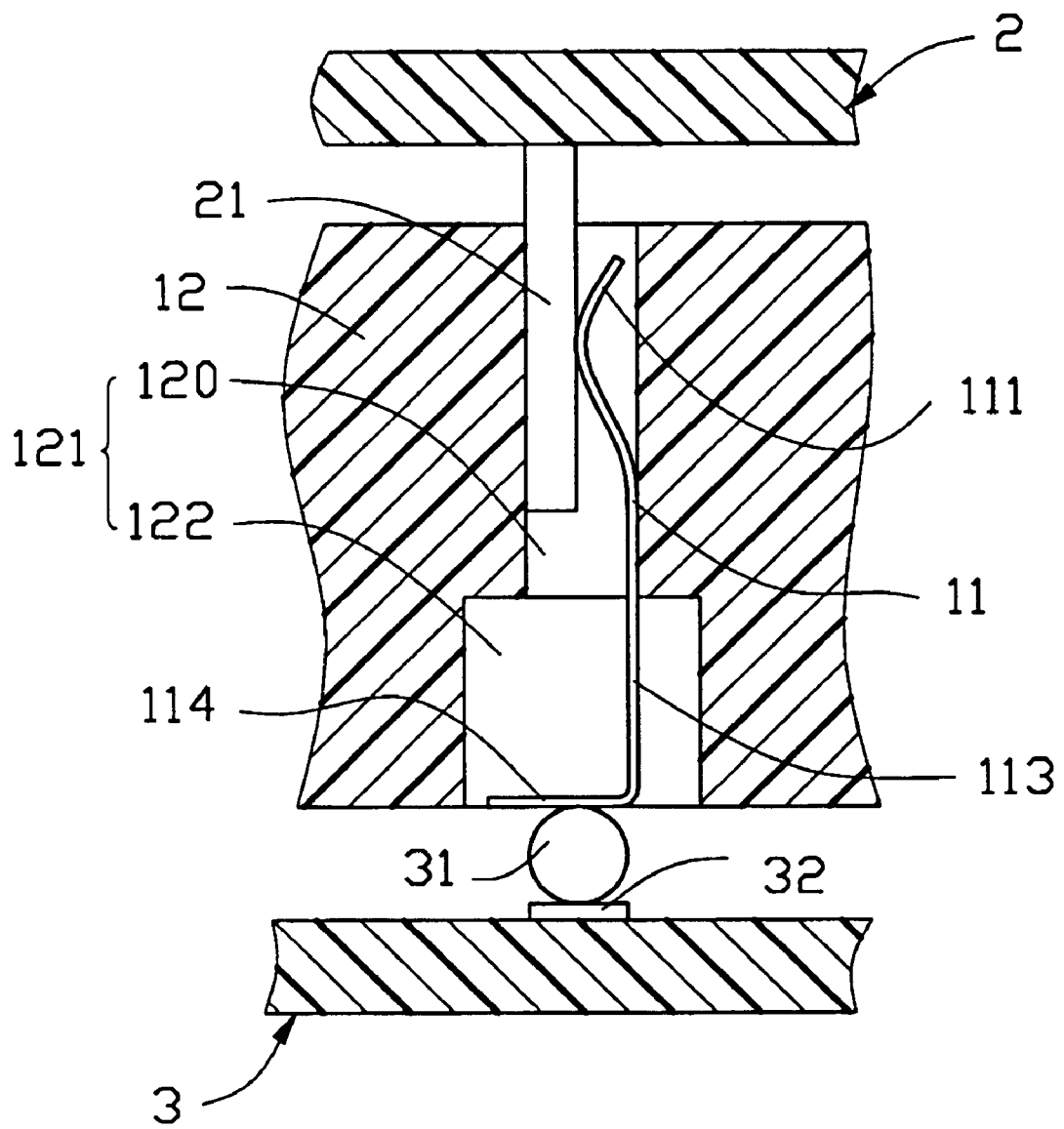
FIG. 3 is a cross-sectional view of the socket mounted on the mother board and receiving a pin of an IC.
Figure 4:
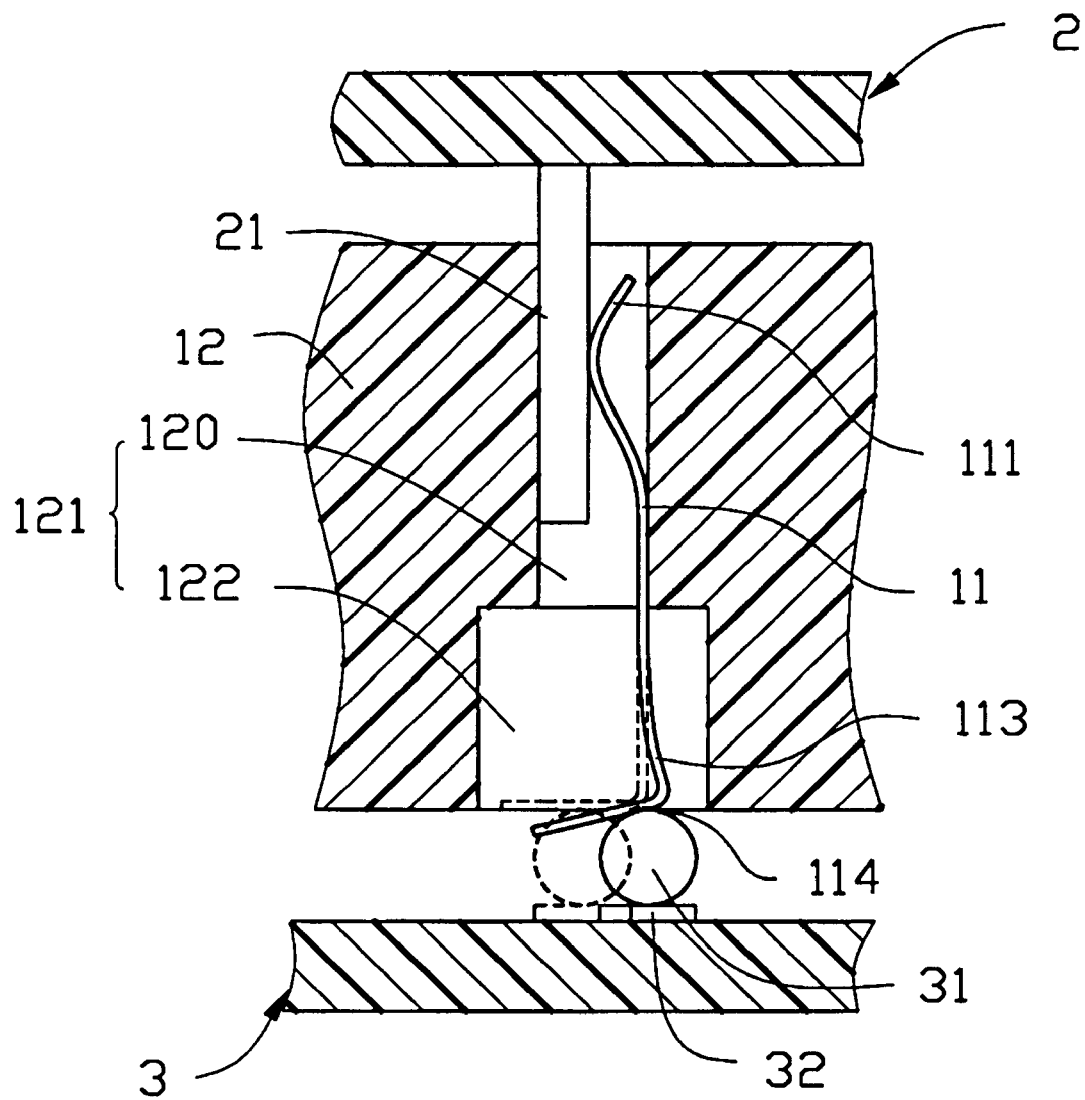
FIG. 4 is another cross-sectional view of the socket, wherein the terminal is deformed due to the relative movement between the socket and the mother board.

Referring to FIGS. 2, 3 and 4, each terminal 11 is unitarily stamped and forms a contact portion 111, a securing portion 112, an adjustment portion 113 and a soldering portion 114. The contact portion 111 has a resilient arcuate structure adapted to engage a pin 21 of an IC 2 inserted into the socket. The securing portion 112 is wider than any other portion of the terminal 11 and forms locking barbs on opposite sides thereof for being interferentially fitted in the passageway 121. The adjustment portion 113 has a gracile structure which provides the adjustment portion 113 with a desirable degree of flexibility. The soldering portion 114 perpendicularly extends from the adjustment portion 113 and has a circular configuration. The passageway 121 has a narrow section 120 and a wide section 122.

In assembly, the securing portion 112 of the terminal 11 is interferentially fitted in the narrow section 120 thereby retaining the terminal 11 within the passageway 121. The adjustment portion 113 of the terminal 11 is disposed in the wide section 122 of the passageway 121 and allowed to move therein. A solder ball 31 is attached to a bottom of the soldering portion 114 of the terminal 11 and then positioned on an electrical pad 32 on a mother board 3. When processed by an infrared soldering procedure, the solder ball 31 becomes molten and bonds the soldering portion 114 and the pad 32 together. Due to the different CTE (Coefficient of Thermal Expansion) of the housing 12 and the mother board 3, the relative position therebetween changes during the soldering process (FIG. 4). The resilient adjustment portion 114 of the terminal 11 absorbs such relative displacement thereby ensuring that the relative displacement does not adversely affect the soldering connection between the soldering portion of the terminal and the mother board.

Figure 5:
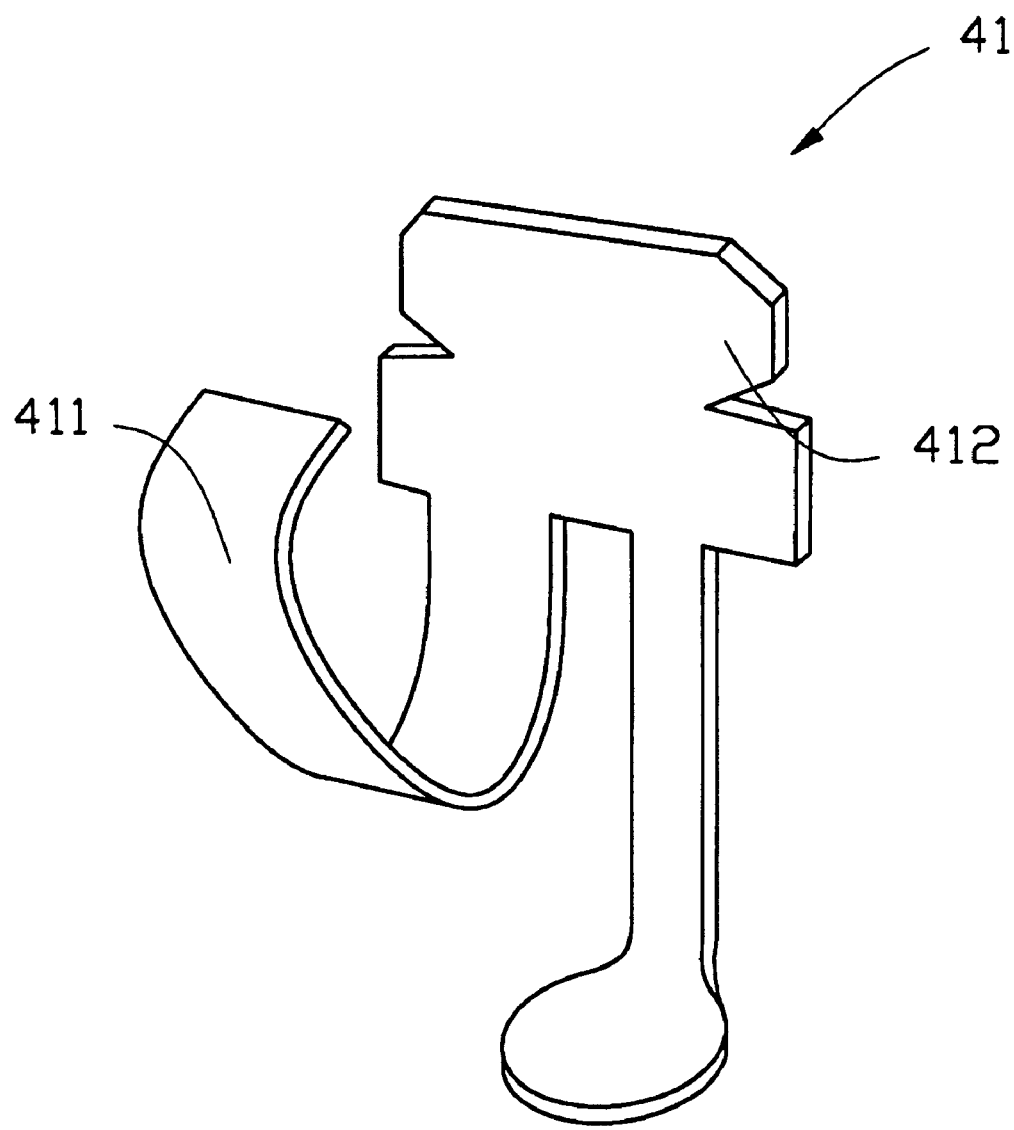
FIG. 5 is a perspective view of a terminal of a second embodiment used in the socket of the present invention.

FIG. 5 illustrates a second embodiment of a terminal 41 constructed in accordance with the present invention. The terminal 41 is similar to the terminal 11 of the first embodiment, except that a U-shaped contact portion 411 thereof extends from a bottom edge of a securing portion 412 for engaging a pin of an inserted IC (not shown). Such a structure provides the contact portion with a significant degree of resiliency for firmly engaging the pin of the IC.

Figure 6:
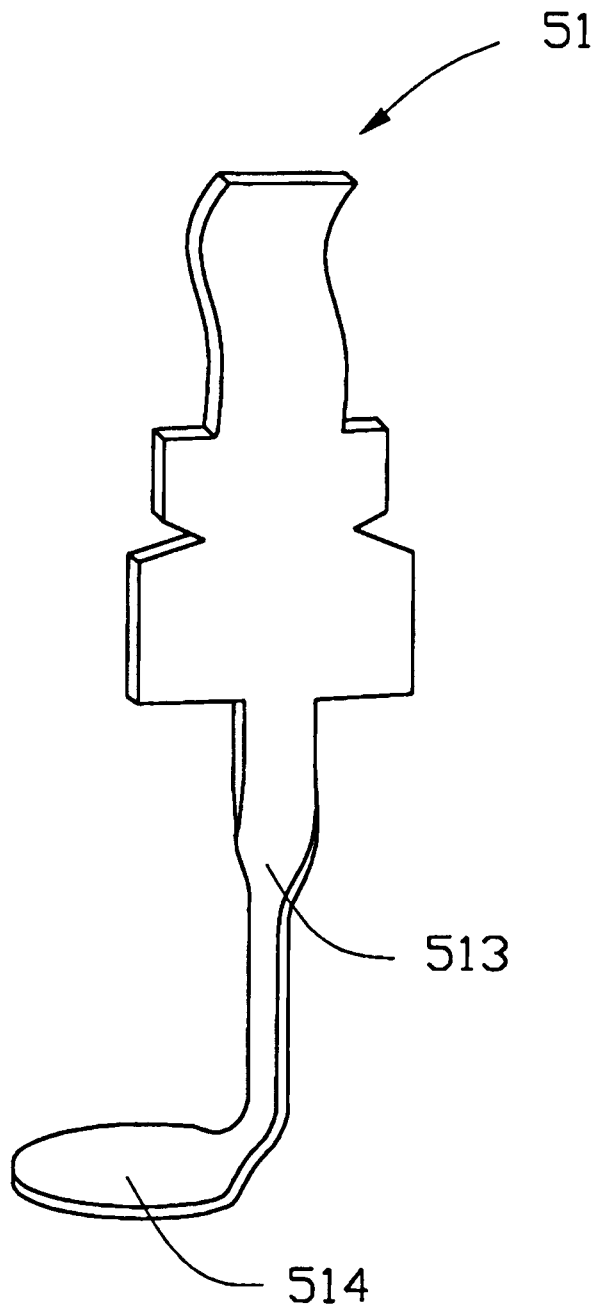
FIG. 6 is a perspective view of a terminal of a third embodiment used in the socket of the present invention.

FIG. 6 illustrates a third embodiment of a terminal 51 constructed in accordance with the present invention. The terminal 51 is similar to the terminal 11 of the first embodiment, except that an adjustment portion 513 thereof is twisted 90-degrees for absorbing relative movement between the housing of the socket and the mother board in two directions.

Figure 7:
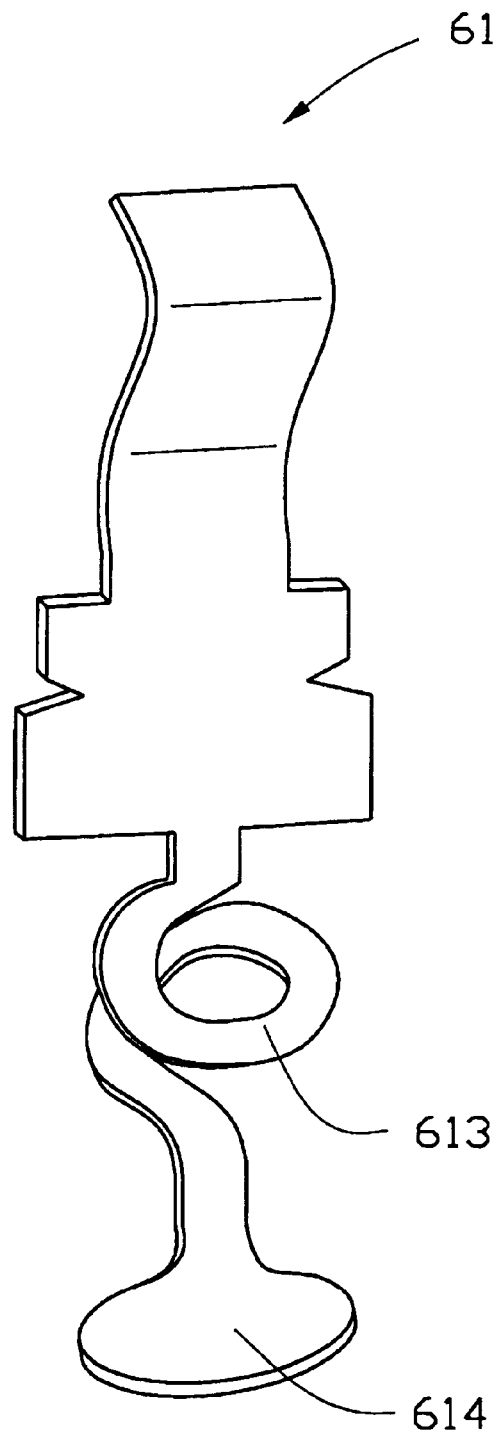
FIG. 7 is a perspective view of a terminal of a forth embodiment used in the socket of the present invention.
Figure 8:
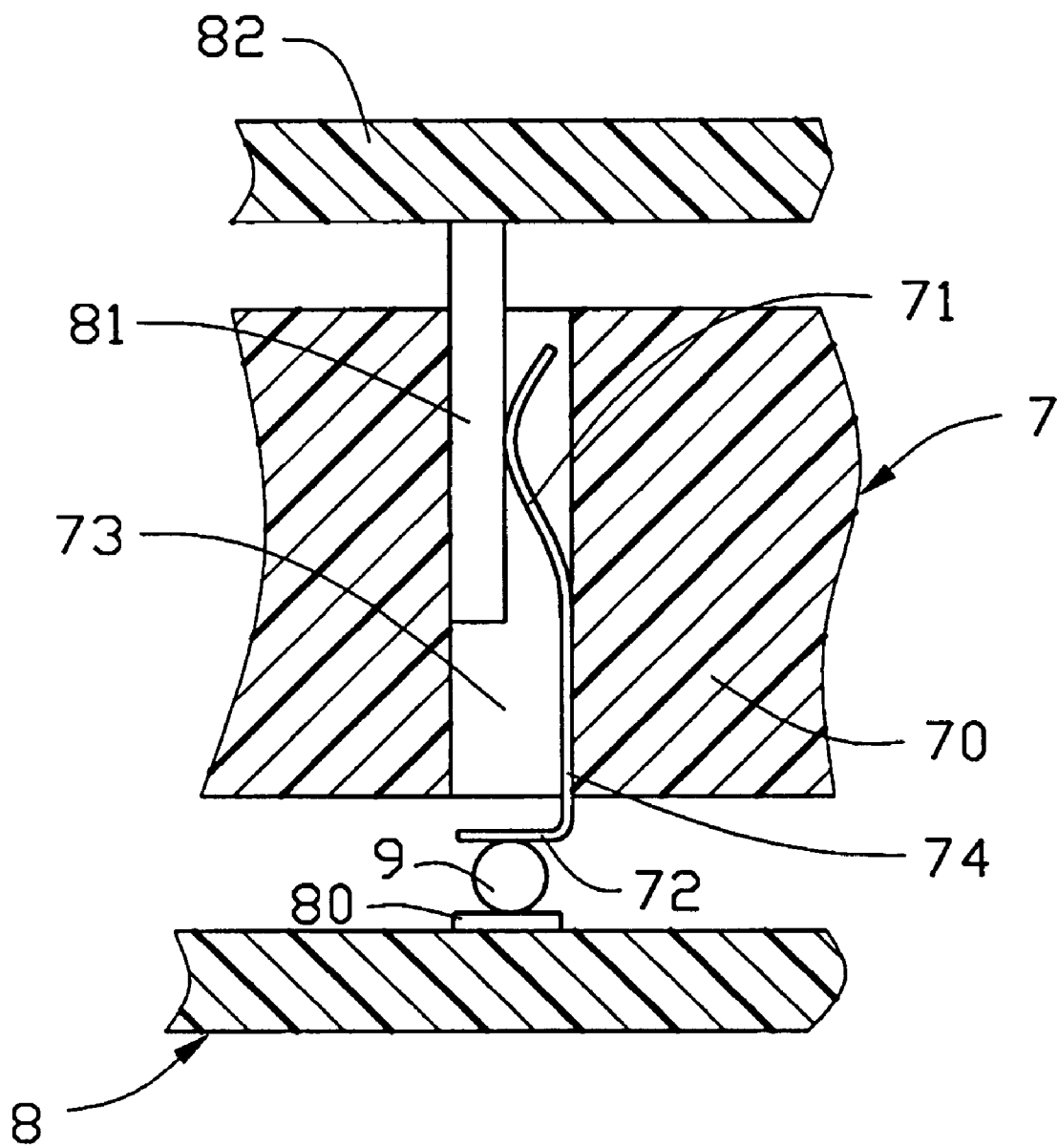
FIG. 8 is a cross-sectional view of a conventional socket mounted on a mother board and receiving a pin of an IC.

FIG. 7 illustrates a fourth embodiment of a terminal 61 constructed in accordance with the present invention. The terminal 61 is similar to the terminal 11 of the first embodiment, except that an adjustment portion 613 thereof has a helical structure for conveniently absorbing relative movement between the housing of the socket and the mother board in all directions.

While the present invention has been described with reference to specific embodiments, the description is illustrative of the invention and is not to be construed as limiting the invention. Various modifications to the present invention can be made to the preferred embodiment by those skilled in the art without departing from the true spirit and scope of the invention as defined by the appended claims.

We claim:

1. An electrical socket for providing electrical connection between an IC and a mother board, comprising:

an insulative housing defining a terminal passageway;

a terminal in said passageway, the terminal further comprising:

a contact portion having a curved structure for contacting a pin of the IC;

a securing portion forming locking barbs on opposite sides thereof for interferingly fitting in said passageway;

an adjustment portion configured to be a resilient structure; and a soldering portion;

wherein the adjustment portion is moveable within the passageway, and wherein the adjustment portion is adapted to resiliently adjust a displacement of the soldering portion relative to the mother board due to differential thermal expansion between the socket and the mother board.

2. The terminal as claimed in claim 1, wherein the securing portion of the terminal is wider than any other portion of the terminal.

3. The terminal as claimed in claim 1, wherein the contact portion of the terminal extends upwardly from the securing portion.

4. The terminal as claimed in claim 1, wherein the contact portion is U-shaped and extends from a top edge of the securing portion.

5. The terminal as claimed in claim 1, wherein each passageway includes a narrow section and a wide section, the wide section allowing the adjustment portion of the terminal to move therein.

6. The terminal as claimed in claim 1, wherein the adjustment portion of each terminal has a gracile structure.

7. The terminal as claimed in claim 1, wherein the adjustment portion of each terminal has a twisted structure.

8. The terminal as claimed in claim 1, wherein the adjustment portion of each terminal has a helical structure.

9. An electrical socket for providing electrical connection between an IC and a mother board, comprising:

an insulative housing defining a top surface, a bottom surface opposite the top surface, and a plurality of terminal passageways extending between the top surface and the bottom surface;

a plurality of terminals received within the corresponding passageways, respectively;

each of said passageways including an upper narrow section and a lower wider section; and each of said terminals including a contact portion received within the upper narrow section, an adjustment portion below the contact portion received within said lower wider section, and a soldering portion at a bottom end thereof; whereby when the soldering portion is horizontally displaced due to different Coefficients of Thermal Expansion (CTE) between the socket and the mother board, the adjustment portion is resiliently laterally deflected within the lower wider section.

10. The socket as claimed in claim 9, wherein the adjustment portion is deflected toward a direction which is away from a pin of said IC engaged with the contact portion of the contact.

* * * * *